United States Patent
Harashima

(10) Patent No.: US 9,245,853 B2
(45) Date of Patent: Jan. 26, 2016

(54) MEMORY MODULE

(71) Applicant: Kabushiki Kaisha Toshiba, Minato-ku (JP)

(72) Inventor: Shiro Harashima, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 63 days.

(21) Appl. No.: 14/140,725

(22) Filed: Dec. 26, 2013

(65) Prior Publication Data
US 2015/0048490 A1    Feb. 19, 2015

Related U.S. Application Data

(60) Provisional application No. 61/865,255, filed on Aug. 13, 2013.

(51) Int. Cl.
| | |
|---|---|
| *H01L 23/60* | (2006.01) |
| *H01L 23/552* | (2006.01) |
| *H01L 23/31* | (2006.01) |
| *H01L 23/00* | (2006.01) |
| *H01L 25/065* | (2006.01) |
| *H01L 25/16* | (2006.01) |

(52) U.S. Cl.
CPC ........... *H01L 23/552* (2013.01); *H01L 23/3121* (2013.01); *H01L 24/06* (2013.01); *H01L 24/32* (2013.01); *H01L 24/33* (2013.01); *H01L 24/48* (2013.01); *H01L 24/73* (2013.01); *H01L 25/0655* (2013.01); *H01L 25/16* (2013.01); *H01L 2224/04042* (2013.01); *H01L 2224/06135* (2013.01); *H01L 2224/32145* (2013.01); *H01L 2224/32225* (2013.01); *H01L 2224/32245* (2013.01); *H01L 2224/33181* (2013.01); *H01L 2224/48091* (2013.01); *H01L 2224/48227* (2013.01); *H01L 2224/73215* (2013.01); *H01L 2224/73265* (2013.01); *H01L 2225/06537* (2013.01); *H01L 2924/1432* (2013.01); *H01L 2924/1433* (2013.01); *H01L 2924/1434* (2013.01); *H01L 2924/14335* (2013.01); *H01L 2924/19105* (2013.01); *H01L 2924/19107* (2013.01); *H01L 2924/3025* (2013.01)

(58) Field of Classification Search
CPC .................. H01L 23/552; H01L 23/60; H01L 2225/06537
USPC ......................................... 257/702, 704, 723
See application file for complete search history.

(56) References Cited

U.S. PATENT DOCUMENTS

| | | | | |
|---|---|---|---|---|
| 6,090,728 | A * | 7/2000 | Yenni et al. | 442/117 |
| 6,665,194 | B1 * | 12/2003 | Patel et al. | 361/767 |
| 7,723,836 | B2 | 5/2010 | Kwon et al. | |
| 2005/0045358 | A1 * | 3/2005 | Arnold | 174/51 |
| 2007/0096335 | A1 * | 5/2007 | Kwon et al. | 257/777 |

(Continued)

*Primary Examiner* — George Fourson, III
(74) *Attorney, Agent, or Firm* — Oblon, McClelland, Maier & Neustadt, L.L.P.

(57) ABSTRACT

According to one embodiment, a memory module includes a substrate, a semiconductor memory device, a plate-form conductive member, wire, and a mold member. The substrate includes a ground terminal to which a ground potential is applied. The semiconductor memory device is provided on the substrate. The plate-form conductive member is provided on the semiconductor memory device. The wire that electrically connects the ground terminal to the plate-form conductive member. The mold member seals the semiconductor memory device on the substrate, the plate-form conductive member and the wire.

8 Claims, 5 Drawing Sheets

(56) References Cited

U.S. PATENT DOCUMENTS

| | | |
|---|---|---|
| 2007/0138614 A1 | 6/2007 | Harrison et al. |
| 2008/0029869 A1 | 2/2008 | Kwon et al. |
| 2010/0244208 A1 | 9/2010 | Pagaila et al. |
| 2012/0292745 A1* | 11/2012 | Park et al. .................... 257/621 |
| 2014/0124906 A1* | 5/2014 | Park et al. .................... 257/659 |
| 2014/0124907 A1* | 5/2014 | Park .............................. 257/659 |

* cited by examiner

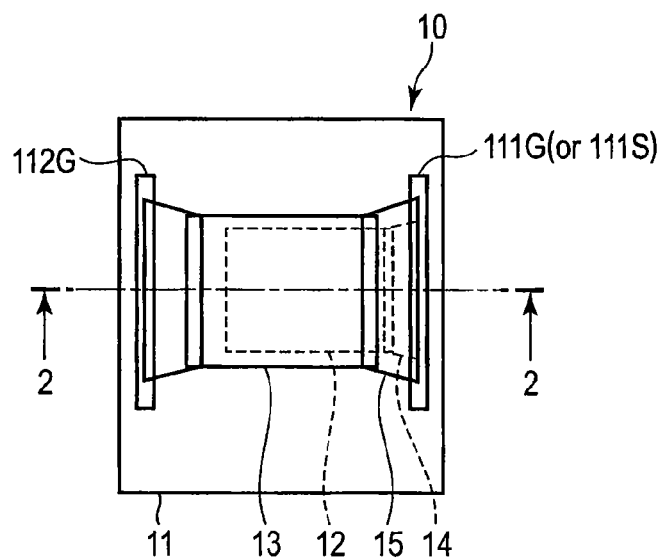
F I G. 1
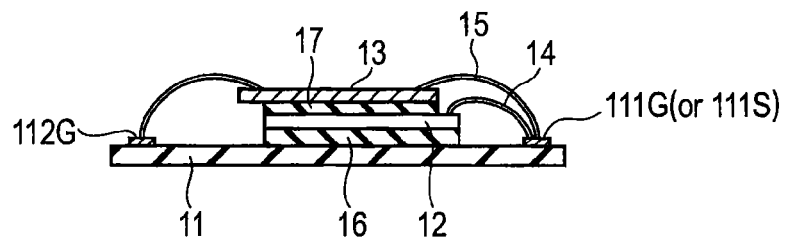
F I G. 2
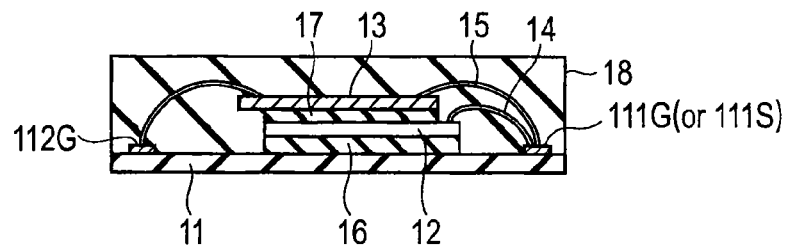
F I G. 3

MEMORY MODULE

CROSS-REFERENCE TO RELATED APPLICATIONS

This application claims the benefit of U.S. Provisional Application No. 61/865,255, filed Aug. 13, 2013, the entire contents of which are incorporated herein by reference.

FIELD

Embodiments described herein relate generally to a memory module.

BACKGROUND

Conventionally, if a personal computer or server is shielded by use of ground (GND) potential, it is generally known to use a method for sufficiently stably connecting a metal casing to a ground terminal on a printed-wiring board by use of screws or the like and making the metal casing itself function as a shield based on the ground potential.

However, in the case of a small and thin mold type semiconductor memory device, a substrate including a chip is entirely sealed with resin. Therefore, even if the metal shield is provided outside the mold, it is impossible to directly connect the metal shield to the ground terminal on the substrate of the semiconductor memory device.

BRIEF DESCRIPTION OF THE DRAWINGS

FIG. 1 is a plan view showing the structure of a memory module of a first embodiment.

FIG. 2 is a cross-sectional view taken along the 2-2 line of the memory module of the first embodiment.

FIG. 3 is a cross-sectional view taken along the 2-2 line of the memory module of the first embodiment.

DETAILED DESCRIPTION

Figure 4:
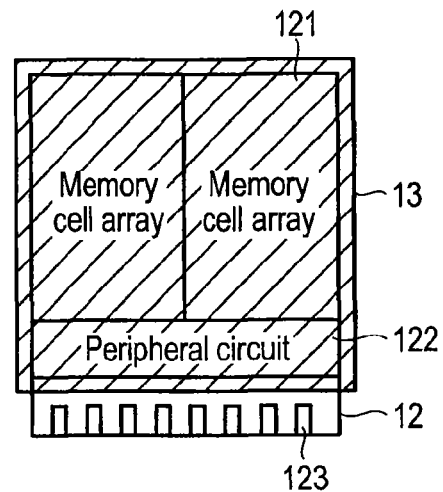
FIG. 4 is a plan view showing the positional relationship between a memory chip in the first embodiment and a plate-form conductive member.

Next, embodiments are explained with reference to the accompanying drawings. In the following explanation, constituent elements having the same functions and configurations are denoted by the same symbols and explanation thereof is only repeated when required. Further, in the following embodiments, devices and methods that embody the technical idea of the embodiments are shown only as an example and the material, shape, structure, arrangement and the like thereof are not limited to the following.

In general, according to one embodiment, a memory module includes a substrate, a semiconductor memory device, a plate-form conductive member, a wire and a mold member. The substrate includes a ground terminal to which a ground potential is applied. The semiconductor memory device is provided on the substrate. The plate-form conductive member is provided on the semiconductor memory device. The wire electrically connects the ground terminal to the plate-form conductive member. The mold member is used for sealing the semiconductor memory device on the substrate, the plate-form conductive member and the wire.

[First Embodiment]

A memory module of a first embodiment is explained.

FIG. 1 is a plan view showing the structure of the memory module of the first embodiment. FIGS. 2, 3 are cross-sectional views taken along the 2-2 line of the memory module. FIG. 2 shows a cross section of a portion from which a mold member is removed.

As shown in the drawing, a memory module 10 includes a substrate 11, a chip of a semiconductor memory device (that is hereinafter referred to as a memory chip) 12, plate-form conductive member 13 and wires 14, 15.

The memory chip 12 is arranged on the substrate 11. The memory chip 12 is fixed on the substrate 11 by use of an adhesive 16. The plate-form conductive member 13 is arranged on the memory chip 12. The plate-form conductive member 13 is fixed on the memory chip 12 by use of an adhesive 17. As the adhesives 16, 17, for example, thermosetting resin is used.

A plurality of pads 111G, 111S are formed around one end portion of the substrate 11. A plurality of pads 112G are formed around the other end portion of the substrate 11 that is opposite to the former one end portion. The pads 111G, 112G are applied with a reference potential, for example, the ground potential. The ground potential is the potential used as a reference when operating the memory chip 12. The pads 111G, 112G applied with the ground potential are hereinafter referred to as ground pads (or ground terminals). The pad 111S is supplied with a signal voltage. The pad 111S supplied with the signal voltage is hereinafter referred to as a signal pad (or signal terminal). A power supply pad applied with a power supply voltage is also formed on the substrate 11, but in this example, the power supply pad is omitted.

Figure 5:
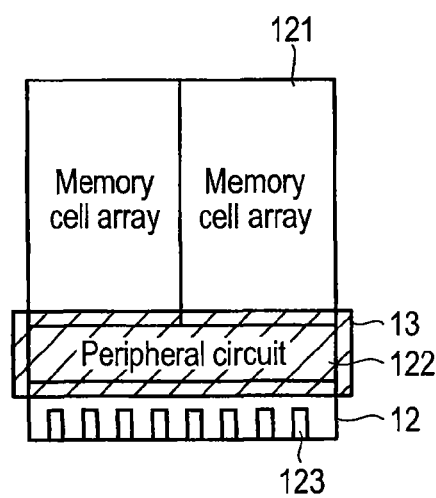
FIG. 5 is a plan view showing the positional relationship between a memory chip in the first embodiment and a plate-form conductive member.
Figure 6:
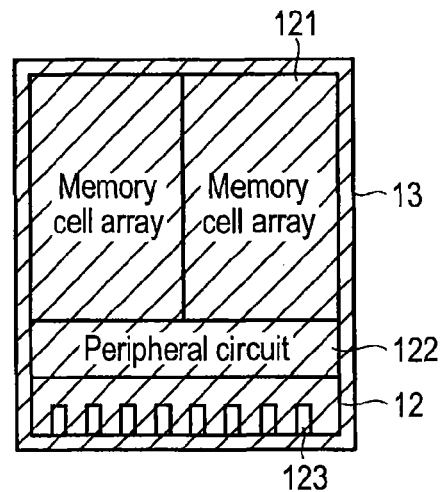
FIG. 6 is a plan view showing the positional relationship between a memory chip in the first embodiment and a plate-form conductive member.

FIGS. 4 to 6 show the layout on the memory chip 12. The memory chip 12 includes memory cell arrays 121, peripheral circuit 122 and pads 123. The memory cell array 121 includes a plurality of memory cells used for data storage. In the peripheral circuit 122, a circuit for operating the memory cell arrays 121 is formed. More specifically, the peripheral circuit 122 includes a circuit for writing, reading and erasing data with respect to the memory cells in the memory cell arrays 121. The pads 123 are terminals that are electrically connected to the peripheral circuit 122 to electrically connect the peripheral circuit 122 to the exterior of the memory chip 12.

For example, the memory chip 12 is configured by a NAND flash memory. The NAND flash memory includes one or more memory cell arrays. Each memory cell array includes a plurality of blocks. Each block includes a plurality of nonvolatile memory cells arranged in a matrix form and is configured by a plurality of pages. Each page is a unit for data writing or reading. Each nonvolatile memory cell is an electrically rewritable memory cell transistor and includes a floating gate electrode and control gate electrode.

The plate-form conductive member 13 includes an insulating plate and a conductive pattern and pads formed on the insulating plate. The plate-form conductive member 13 is configured by a silicon interposer, for example. The silicon interposer includes a plate-form silicon member, conductive pattern and pad. The conductive pattern is formed on substantially the entire surface of the plate-form silicon member. If the conductive pattern is formed of a conductive material, the conductive pattern can be satisfactorily used and is formed of, for example, a metal such as aluminum or copper. The conductive pattern may be formed on a part of the surface of the plate-form silicon member. For example, the conductive pattern may be a plane form or mesh-like form. Further, the conductive pattern may be formed not on the surface of the plate-form silicon member but in the internal portion thereof. In addition, the plate-form conductive member 13 may be formed of a metal plate, for example.

As shown in FIGS. 1 to 3, the wire 14 is bonded between the signal pad 111S of the substrate 11 and the pad of the memory chip 12. The wire 14 electrically connects the signal pad 111S and the pad of the memory chip 12 to each other. Further, the wire 15 is bonded between the ground pad 111G of the substrate 11 and the pad of the plate-form conductive member 13. The wire 15 electrically connects the ground pad 111G and the pad of the plate-form conductive member 13 to each other.

As shown in FIG. 3, a mold member 18 that seals the memory chip 12, plate-form conductive member 13 and wires 14, 15 is formed on the substrate 11. If the mold member 18 is thus formed, the memory chip 12, plate-form conductive member 13 and wires 14, 15 are protected. More specifically, the memory chip 12, plate-form conductive member 13 and wires 14, 15 are protected from external stress, moisture, contaminant materials or the like by sealing the portion on the substrate 11 with the mold member 18. As described above, a mold type package (memory module) is thus formed.

Next, the positional relationship between the memory chip 12 and the plate-form conductive member 13 that covers the memory chip 12 is explained. FIGS. 4 to 6 are plan views each showing the positional relationship between the memory chip 12 and the plate-form conductive member 13.

As shown in FIGS. 4 to 6, the memory chip 12 includes the memory cell arrays (memory circuits) 121, peripheral circuit 122 and pads (or terminals) 123. The memory cell array 121 includes a plurality of memory cells for data storage. The peripheral circuit 122 and pads 123 are arranged in the peripheral region of the memory chip 12 and the peripheral circuit 122 is arranged between the memory cell arrays 121 and the pads 123. The pads 123 are terminals used for electrically connecting the memory chip 12 to the exterior of the memory chip 12.

As shown in FIG. 4, the plate-form conductive member 13 is arranged on a circuit portion other than the portion on the pads 123, that is, arranged on the memory cell arrays 121 and peripheral circuit 122. Thus, if the portions on the memory cell arrays 121 and peripheral circuit 122 are covered with the plate-form conductive member 13, electromagnetic noise generated from the circuit portion can be interrupted by means of the plate-form conductive member 13.

Further, as shown in FIG. 5, the plate-form conductive member 13 is arranged only on the peripheral circuit 122 except for portions on the memory cell arrays 121 and pads 123. Thus, if the portion only on the peripheral circuit 122 is covered with the plate-form conductive member 13, electromagnetic noise generated from the peripheral circuit 122 can be interrupted by means of the plate-form conductive member 13. In the memory chip 12, since electromagnetic noise tends to be generated from the peripheral circuit 122 including a switch circuit and the like, most of the electromagnetic noise can be reduced even if only the portion on the peripheral circuit 122 is covered.

Further, as shown in FIG. 6, the plate-form conductive member 13 is arranged on the entire surface of the memory chip 12 including the memory cell arrays 121, peripheral circuit 122 and pads 123. Thus, if the entire surface of the memory chip 12 is covered with the plate-form conductive member 13, electromagnetic noise generated from the memory chip 12 can be further reduced.

When the entire surface of the memory chip 12 is covered with the plate-form conductive member 13, that is, when the portion on the pads 123 is also covered with the plate-form conductive member 13, for example, wires can be connected to the pads 123 of the memory chip 12 if a film-on wire technique is used.

Figure 7:
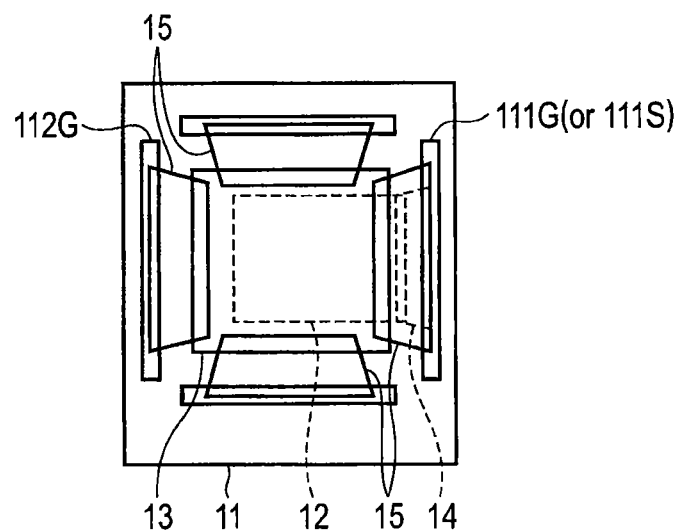
FIG. 7 is a plan view showing another example of the structure of the memory module of the first embodiment.

In the memory module shown in FIG. 1, the ground pads are formed on one side of the plate-form conductive member 13 and on the other side opposite to the above one side in the plate-form conductive member 13 having a rectangular shape and the wires are bonded to the ground pads. However, as shown in FIG. 7, ground pads may be formed on the four sides of the plate-form conductive member 13 and wires may be bonded to the ground pads. Thus, if the wires are bonded to the four sides of the plate-form conductive member 13 having the rectangular shape, the ground potential can be more easily applied to the conductive pattern of the plate-form conductive member 13 than in the case of the memory module shown in FIG. 1. As a result, electromagnetic noise can be more stably reduced by means of the plate-form conductive member 13.

Further, ground pads may be formed only on one side of the plate-form conductive member 13 and wires can be bonded to the ground pads.

It is more desirable to use a larger number of ground pads formed on the plate-form conductive member 13 and a larger number of wires bonded to the ground pads. The shape of the ground pad is not particularly specified. Further, the connection area between the ground pad and the wire is preferably set larger to reduce the contact resistance. Also, the shape of the plate-form conductive member 13 is not limited to rectangular and the shape can be another polygon, circle or ellipse. When wires and passive parts other than the memory chip 12 are included in the mold member 18, the plate-form conductive member 13 may be arranged on the wires and passive parts.

In the first embodiment, the plate-form conductive member 13 is arranged on the memory chip 12 and sealed together with the memory chip by the mold member. The conductive pattern of the plate-form conductive member 13 is connected to the ground terminal and the plate-form conductive member 13 functions as a ground shield with respect to the memory chip 12. By thus making the plate-form conductive member 13 function as the ground shield, EMI (electromagnetic interference) from the memory chip 12 and the peripheral wires thereof can be reduced. Further, the plate-form conductive member 13 can be used as a radiator of heat generated from the memory chip 12 and a path for the ground potential of the substrate 11 including the memory chip 12.

[Second Embodiment]

In the first embodiment, one example in which the shield member that shields electromagnetic waves is provided in the mold member in the mold type memory module is explained. In a second embodiment, an example in which a shield member is provided outside a mold type memory module is explained. In the second embodiment, the mold type memory module shown in the first embodiment is referred to as a memory package.

Figure 8:
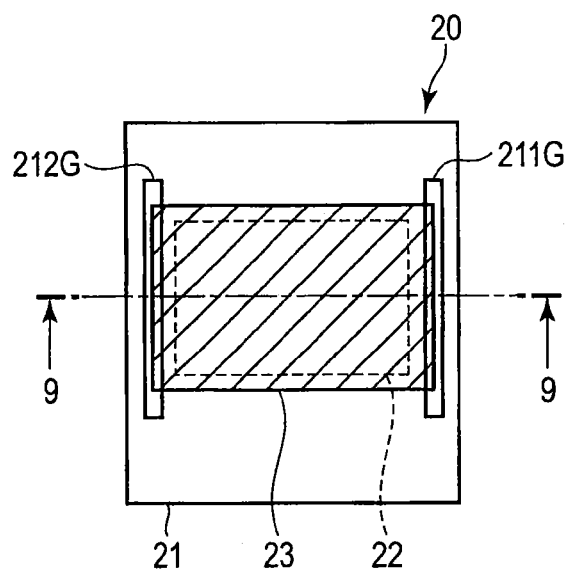
FIG. 8 is a plan view showing the structure of a memory module of a second embodiment.
Figure 9:
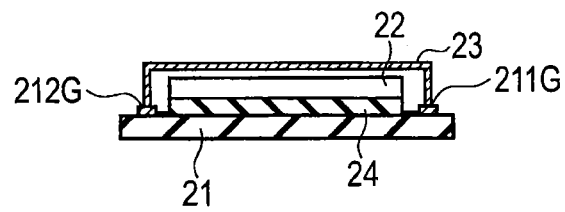
FIG. 9 is a cross-sectional view taken along the 9-9 line of the memory module of the second embodiment.

FIG. 8 is a plan view showing the structure of a memory module of the second embodiment. FIG. 9 is a cross-sectional view taken along the 9-9 line of the memory module.

As shown in the drawing, a memory module 20 includes a printed-wiring board 21, semiconductor memory device (that is hereinafter referred to as a memory package) 22 and flexible printed-wiring (printed circuits) board (that is hereinafter referred to as a flexible wiring board) 23.

The memory package 22 is arranged on the printed-wiring board 21. An adhesive 24 is provided between the printed-wiring board 21 and the memory package 22 and the memory package 22 is fixed on the printed-wiring board 21 via the adhesive 24. The flexible wiring board is arranged on the memory package 22. As the adhesive 24, for example, thermosetting resin is used.

A plurality of pads 211G are formed around one end portion of the printed-wiring board 21. A plurality of pads 212G are formed around the other end portion of the printed-wiring board 21 that is opposite to the above one end portion. The pads 211G, 212G are each applied with a reference potential, for example, the ground potential. The pads 211G, 212G applied with the ground potential are hereinafter referred to as ground pads (or ground terminals).

The memory package 22 has the structure obtained by omitting the plate-form conductive member 13, wires 15, adhesive 17 and ground pads 111G, 112G connected to the wires 15 from the memory module shown in FIG. 3. The memory package 22 may have the same structure as that of the memory module shown in FIG. 3.

The flexible wiring board 23 is a flexible and deformable printed-wiring board. The flexible wiring board 23 has a structure having a conductive pattern (for example, copper or the like) formed on a film-like insulating body (for example, polyimide film or the like) or a structure having a conductive pattern disposed between two-layered film-like insulating bodies.

The terminals of the conductive pattern of the flexible wiring board 23 are connected to the ground pads 211G, 212G other than pads supplied with a signal voltage or power supply voltage by soldering or bonding, for example. Therefore, the terminals of the conductive pattern of the flexible wiring board 23 are electrically connected to the ground pads 211G, 212G. The conductive pattern of the flexible wiring board 23 is applied with the ground potential.

As shown in FIGS. 8, 9, the flexible wiring board 23 is arranged on the memory package 22. If the memory package 22 is covered with the flexible wiring board 23 set at the ground potential, electromagnetic noise generated from the memory package 22 can be interrupted by means of the flexible wiring board 23.

Figure 10:
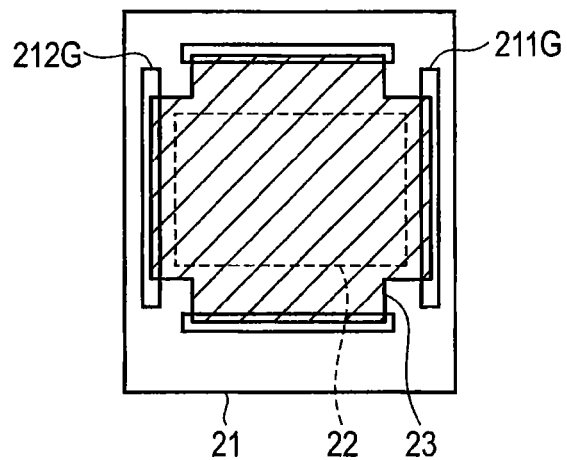
FIG. 10 is a plan view showing another example of the structure of the memory module of the second embodiment.

Further, in the memory module shown in FIG. 8, the ground pads 211G, 212G are formed on the printed-wiring board 21 on one side of the memory package 22 and the other side opposite to the above one side and the terminals of the flexible wiring board 23 are connected to the ground pads. However, as shown in FIG. 10, ground pads may be formed on the printed-wiring board 21 on the four sides of the memory package 22 and the terminals of the flexible wiring board 23 may be connected to the ground pads. Thus, if the terminals of the flexible wiring board 23 are connected to the four sides of the memory package 22, the ground potential can be more easily applied to the conductive pattern of the flexible wiring board 23 than in the case of the memory module shown in FIG. 8. As a result, electromagnetic noise can be more stably reduced by means of the flexible wiring board 23.

Further, ground pads may be formed on the printed-wiring board 21 only on one side of the memory package 22 and the terminals of the flexible wiring board 23 can be connected to the ground pads. However, it is more desirable to provide ground pads on a larger number of sides of the memory package 22 and connect the terminals of the flexible wiring board 23 to the ground pads.

Further, the shape of the ground pad is not particularly specified. Further, the connection area between the ground pad and the terminal of the flexible wiring board 23 is preferably set larger. When wires and passive parts other than the memory package 22 are arranged on the printed-wiring board 21, the flexible wiring board 23 may be arranged on the wires and passive parts. As a result, electromagnetic noise generated from the wires and passive parts can be interrupted by means of the flexible wiring board 23.

Next, a memory module of a modification of the second embodiment is explained. In the second embodiment, the ground pads are formed on the surface (first surface) of the substrate 21 on which the memory package 22 is mounted and the flexible wiring board 23 is connected to the ground pads. In this modification, ground pads are formed on a surface (second surface) opposite to the surface on which the memory package is mounted and a flexible wiring board 23 is connected to the ground pads.

Figure 11:
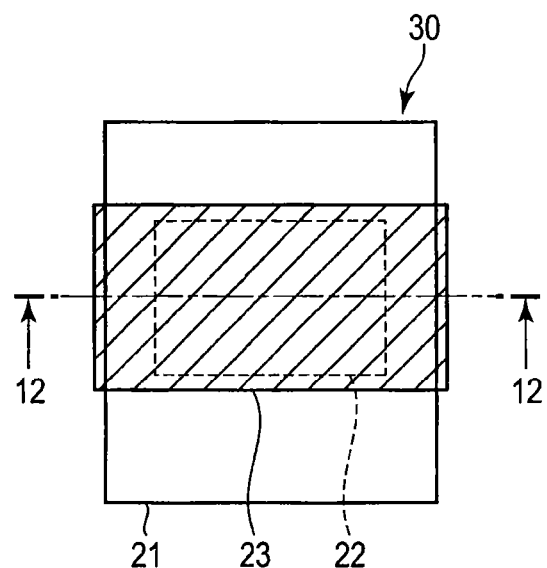
FIG. 11 is a plan view showing the structure of a memory module of a modification of the second embodiment.
Figure 12:
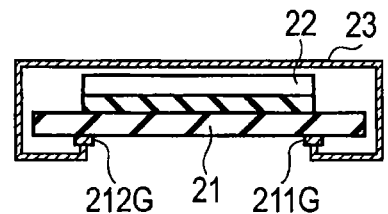
FIG. 12 is a cross-sectional view taken along the 12-12 line of the modification of the memory module of the second embodiment.

FIG. 11 is a plan view showing the structure of the memory module of the modification of the second embodiment. FIG. 12 is a cross-sectional view taken along the 12-12 line of the above memory module. As shown in the drawing, a memory module 30 includes a printed-wiring board 21, memory package 22 and flexible wiring board 23.

The memory package 22 is arranged on the printed-wiring board 21. The memory package 22 is fixed on the printed-wiring board 21 via an adhesive 24. The flexible wiring board 23 is arranged on the memory package 22.

The printed-wiring board 21 has the first surface on which the memory package 22 is arranged and the second surface opposite to the first surface. A plurality of ground pads 211G are formed on the second surface around one end portion of the printed-wiring board 21. A plurality of ground pads 212G are formed on the second surface around the other end portion of the printed-wiring board 21 that is opposite to the one end portion. The pads 211G, 212G are applied with a reference potential, for example, the ground potential.

The terminals of the conductive pattern of the flexible wiring board 23 are connected to the ground pads 211G, 212G on the second surface other than pads supplied with a signal voltage and power supply voltage by soldering or bonding, for example. More specifically, since the flexible wiring board 23 is flexible and deformable, the flexible wiring board 23 extends over the end portion of the printed-wiring board 21 from the first surface side to the second surface side and the terminals thereof are connected to the ground pads 211G, 212G.

As a result, the terminals of the conductive pattern of the flexible wiring board 23 are electrically connected to the ground pads 211G, 212G. Further, the ground potential is applied to the conductive pattern of the flexible wiring board 23.

As shown in FIGS. 11, 12, the flexible wiring board 23 is arranged on the memory package 22. If the memory package 22 is thus covered with the flexible wiring board 23 set at the ground potential, electromagnetic noise generated from the memory package 22 can be interrupted by means of the flexible wiring board 23.

Further, if a region on which the pads are arranged is not provided on the first surface on which the memory package 22 is mounted, the degree of freedom of mounting other electronic parts on the first surface can be increased by arranging the pads on the second surface and connecting the flexible wiring board 23 to the pads.

Next, an example of mounting the memory module of the second embodiment on the printed-wiring board is explained with reference to FIGS. 13 to 16.

Figure 13:
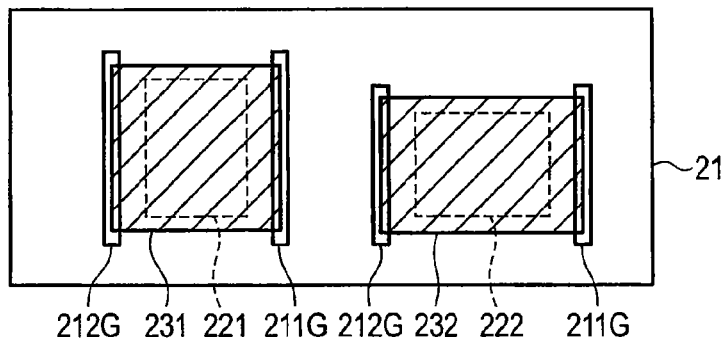
FIG. 13 is a view showing an example in which the memory module of the second embodiment is mounted on a printed-wiring board.

As shown in FIG. 13, when a plurality of memory packages 221, 222 are arranged on the printed-wiring board 21, flexible wiring boards 231, 232 are respectively arranged on the memory packages 221, 222. If the memory packages 221, 222 are respectively covered with the flexible wiring boards 231, 232, electromagnetic noises generated from the memory packages 221, 222 can be interrupted by means of the flexible wiring boards 231, 232.

Figure 14:
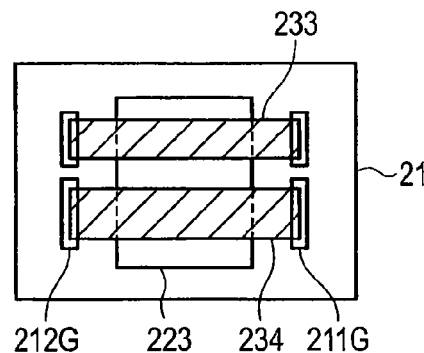
FIG. 14 is a view showing another example in which the memory module of the second embodiment is mounted on a printed-wiring board.

Further, as shown in FIG. 14, when a memory package 223 is arranged on the printed-wiring board 21, a plurality of flexible wiring boards 233, 234 are arranged on the memory package 223. If regions in which electromagnetic noise tends to occur are present in the memory package 223, for example, if regions in which the peripheral circuit described before is formed are present, the flexible wiring boards 233, 234 are arranged on the respective regions.

If the regions of the memory package 223 in which electromagnetic noise tends to occur are covered with the flexible wiring boards 233, 234, most of the electromagnetic noise generated from the memory package 223 can be interrupted by means of the flexible wiring boards 233, 234.

Figure 15:
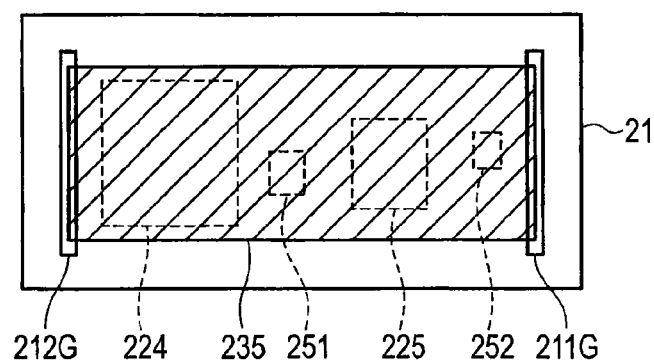
FIG. 15 is a view showing a still another example in which the memory module of the second embodiment is mounted on a printed-wiring board.

Further, as shown in FIG. 15, when a plurality of memory packages 224, 225 and electronic parts 251, 252 are arranged on the printed-wiring board 21, a flexible wiring board 235 is arranged on the memory packages 224, 225 and electronic parts 251, 252. If the memory packages 224, 225 and electronic parts 251, 252 are thus covered with the flexible wiring board 235, electromagnetic noises generated from the memory packages and electronic parts can be interrupted by means of the flexible wiring board 235.

Figure 16:
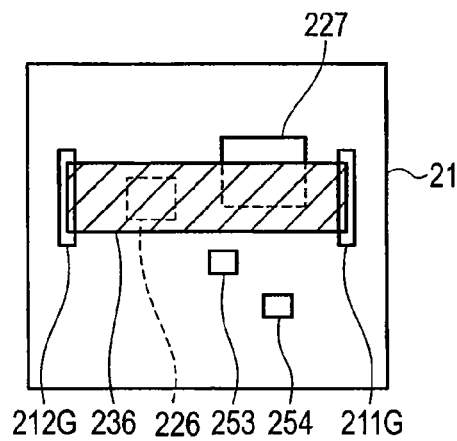
FIG. 16 is a view showing a further example in which the memory module of the second embodiment is mounted on a printed-wiring board.

Further, as shown in FIG. 16, when a plurality of memory packages 226, 227 and electronic parts 253, 254 are arranged on the printed-wiring board 21, a flexible wiring board 236 is arranged on the memory package 226 and on a partial region of the memory package 227. If a region in which electromagnetic noise tends to occur is present in the memory package 227, for example, if a region in which the peripheral circuit is formed is present, the flexible wiring board 236 is arranged only on the above region. If the electromagnetic noise generated from the electronic parts 253, 254 is reduced, it is unnecessary to arrange the flexible wiring board 236 on the electronic parts 253, 254.

If the memory package 226 and the region of the memory package 227 in which electromagnetic noise tends to occur are covered with the flexible wiring board 236, most of the electromagnetic noise generated from the memory packages 226, 227 can be interrupted by means of the flexible wiring board 236.

The mounting examples shown in FIGS. 13 to 16 can be applied to the modification in which the ground pads are formed on the surface (second surface) opposite to the surface on which the memory package is mounted and the flexible wiring board is connected to the ground pads.

In the second embodiment and modification, the flexible wiring board 23 is arranged to cover the memory package 22. The conductive pattern of the flexible wiring board 23 is connected to the ground terminals and the flexible wiring board 23 functions as a ground shield with respect to the memory package 22. By making the flexible wiring board 23 function as the ground shield, EMI (electromagnetic interference) from the memory package and the peripheral wires thereof can be reduced. Further, the flexible wiring board 23 can be used as a radiator of heat generated from the memory chip 22 and the path of the ground potential of the substrate 21 including the memory package 22.

In the second embodiment and modification, the mold type package sealed with the mold member is described as an example of the semiconductor memory device arranged on the substrate, but another package such as a ceramic package sealed with a ceramic member can be applied.

Further, in the first and second embodiments and modification, the example in which the semiconductor memory device (memory chip or memory package) is arranged on the substrate and EMI from the semiconductor memory device is reduced is described. However, the embodiments and the like are not limited to the semiconductor memory device and when another semiconductor device (semiconductor integrated circuit) such as a system LSI, ASIC (application specific integrated circuit), CPU (central processing unit), DSP (digital signal processor), ISP (image signal processor) or CMOS image sensor is arranged instead of the semiconductor memory device, EMI from the above semiconductor device can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory module comprising:
   a substrate comprising a ground terminal to which a ground potential is applied;
   a first semiconductor memory device provided on the substrate, the first semiconductor memory device comprising a mold type semiconductor package comprising a semiconductor memory chip sealed with resin; and
   a first flexible printed-wiring board configured to cover the first semiconductor memory device, the first flexible printed-wiring board comprising a conductive pattern and the conductive pattern being connected to the ground terminal except terminals to which a signal and power supply voltage are supplied.

2. The memory module according to claim 1, further comprising a second semiconductor memory device provided on the substrate, and wherein the first flexible printed-wiring board is configured to cover the second semiconductor memory device.

3. The memory module according to claim 1, further comprising a second flexible printed-wiring board configured to cover the first semiconductor memory device, and wherein
the second flexible printed-wiring board comprises a conductive pattern, and
the conductive pattern is connected to the ground terminal.

4. The memory module according to claim 1, wherein the first semiconductor memory device comprises a semiconductor package comprising a semiconductor memory chip packaged therein.

5. A memory module comprising:
a substrate comprising a ground terminal to which a ground potential is applied, the substrate having a first surface and a second surface opposite to the first surface and the ground terminal being arranged on the second surface of the substrate;
a first semiconductor memory device provided on the first surface of the substrate, the first semiconductor memory device comprising a mold type semiconductor package comprising a semiconductor memory chip sealed with resin; and
a first flexible printed-wiring board configured to cover the first semiconductor memory device, the first flexible printed-wiring board comprising a conductive pattern and the conductive pattern being connected to the ground terminal except terminals to which a signal and power supply voltage are supplied.

6. The memory module according to claim 5, further comprising a second semiconductor memory device provided on the first surface of the substrate, and
wherein the first flexible printed-wiring board is configured to cover the second semiconductor memory device.

7. The memory module according to claim 5, further comprising a second flexible printed-wiring board arranged to cover the first semiconductor memory device, and wherein the second flexible printed-wiring board comprises a conductive pattern and the conductive pattern being connected to the ground terminal.

8. The memory module according to claim 5, wherein the first semiconductor memory device comprises a semiconductor package comprising a semiconductor memory chip packaged therein.

* * * * *